(12) United States Patent
Brazier

(10) Patent No.: US 6,358,326 B1
(45) Date of Patent: Mar. 19, 2002

(54) PROCESS FOR THE PREPARATION OF FLEXIBLE BLOCKS FROM PHOTOPOLYMER PLATES USING OFFSET BRUSHES

(75) Inventor: David Brazier, High Wycome (GB)

(73) Assignee: Photomeca/Egg, Pompey (FR)

( * ) Notice: Subject to any disclaimer, the term of this patent is extended or adjusted under 35 U.S.C. 154(b) by 0 days.

(21) Appl. No.: 09/440,916

(22) Filed: Nov. 16, 1999

(30) Foreign Application Priority Data

Nov. 17, 1998 (FR) .............................. 98 14516

(51) Int. Cl.$^7$ .............................. B08B 1/00; B08B 1/02; B08B 1/04
(52) U.S. Cl. .............................. 134/6; 134/32; 15/21.1; 15/77
(58) Field of Search .............................. 134/6, 32, 42; 15/21.1, 77, 88.2

(56) References Cited

U.S. PATENT DOCUMENTS 5,436,105 A  7/1995 Shimizu

FOREIGN PATENT DOCUMENTS

EP  0592343  4/1994

Primary Examiner—Zeinab El-Arini
(74) Attorney, Agent, or Firm—Gary M. Cohen

(57) ABSTRACT

A method for making plates from photopolymer sheets which have previously been exposed to ultraviolet radiation, to convert the sheets into printing plates for flexographic, letterpress or dry-offset printing, includes brushing the exposed faces of the sheets with a brush assembly having a row of flat brushes with generally rectangular brushing surfaces. The brushes each undergo a movement of horizontal rotation and the brush assembly also undergoes at least one movement of reciprocating horizontal translation. Each brush is offset by 180° in its horizontal rotation with respect to the immediately adjacent brush, or to the two immediately adjacent brushes in the row. Also disclosed is an apparatus for performing the method.

9 Claims, 2 Drawing Sheets

PROCESS FOR THE PREPARATION OF FLEXIBLE BLOCKS FROM PHOTOPOLYMER PLATES USING OFFSET BRUSHES

BACKGROUND OF THE INVENTION

The present invention generally relates to a method for producing flexible plates from a photopolymer sheet. Such plates are usable for producing printed matter which is printed using a flexographic, letterpress or dry-offset printing method. More particularly, the present invention relates to the step of brushing the photopolymer sheet used for making such plates, and to a device for implementing the method of the present invention.

Flexible plates are usually produced by exposing a sensitive sheet of photopolymer material to ultraviolet radiation, with the interposition of a negative film which leaves those zones which need to appear in relief on the plate when the plate is finished exposed to the radiation. The radiation hardens the exposed zones. The material of the protected surface is then removed by brushing the photopolymer sheet using flat or rotary brushes, and a solvent or an aqueous base, depending on the type of sheet.

In the method of the present invention, the exposed face of the sheet is brushed by a brush assembly made up of a row of flat brushes with essentially rectangular brushing surfaces. The brushes each undergo a movement of horizontal rotation and the brush assembly also undergoes a movement of reciprocating horizontal translation.

Methods for producing flexible plates are known from the prior art. In particular, European Patent Application No. 0,592,343, which is incorporated herein by reference and which is commonly owned, discloses an automated method for making flexible plates from a sheet introduced with the sensitive face uppermost, and an apparatus for implementing the disclosed method. The present invention constitutes an improvement to this earlier application.

U.S. Pat. No. 5,436,105, in particular, the drawings, discloses a brushing method which combines both brushing in a horizontal to-and-fro movement in a direction that is transverse to the direction of forward travel of the photopolymer sheet and rotational brushing using brushes with circular brushing surfaces. However, this type of brushing gives rise to a major drawback in that the mechanical stresses created on the photopolymer sheet by the various movements are such that the stresses oppose the uniform and precise progression of the photopolymer sheet through the brushing section.

SUMMARY OF THE INVENTION

The present invention serves to overcome this drawback by providing brushes that are offset by 180° in horizontal rotation with respect to the immediately adjacent brush, or to the two immediately adjacent brushes in a row of brushes. Such rotation of the brush, or of the two brushes immediately adjacent to each brush, has the effect of cancelling the stresses caused by rotation of the brush on the photopolymer sheet so that the photopolymer sheet can then progress through the brushing section with the required precision.

The improvements of the present invention can both improve the brushing step described in European Patent Application No. 0,592,343 and allow the brushing step to be performed even more quickly, by performing it continuously.

Advantageously, the brushing section (which is defined by the extreme positions of the brushes throughout the brushing step) allows the photopolymer sheets to be brushed across their width, irrespective of their length. It is also advantageous that when the movement (a reciprocating horizontal translation) of the set of brushes is performed in a direction that is at a right angle to the direction of travel of the photopolymer sheet, through the brushes section, the entire surface of the photopolymer sheet is brushed by at least two adjacent brushes.

Regarding the transmission of rotational movement, it is recommended that at least one crank-type transmission shaft be arranged at each end of the brushes, and that the cranks are rotated using a single motor.

BRIEF DESCRIPTION OF THE DRAWINGS

The present invention will be better understood with reference to the description of the invention which is provided below, and which is given by way of explanation with reference to the following drawings.

DETAILED DESCRIPTION OF THE INVENTION

Figure 1:
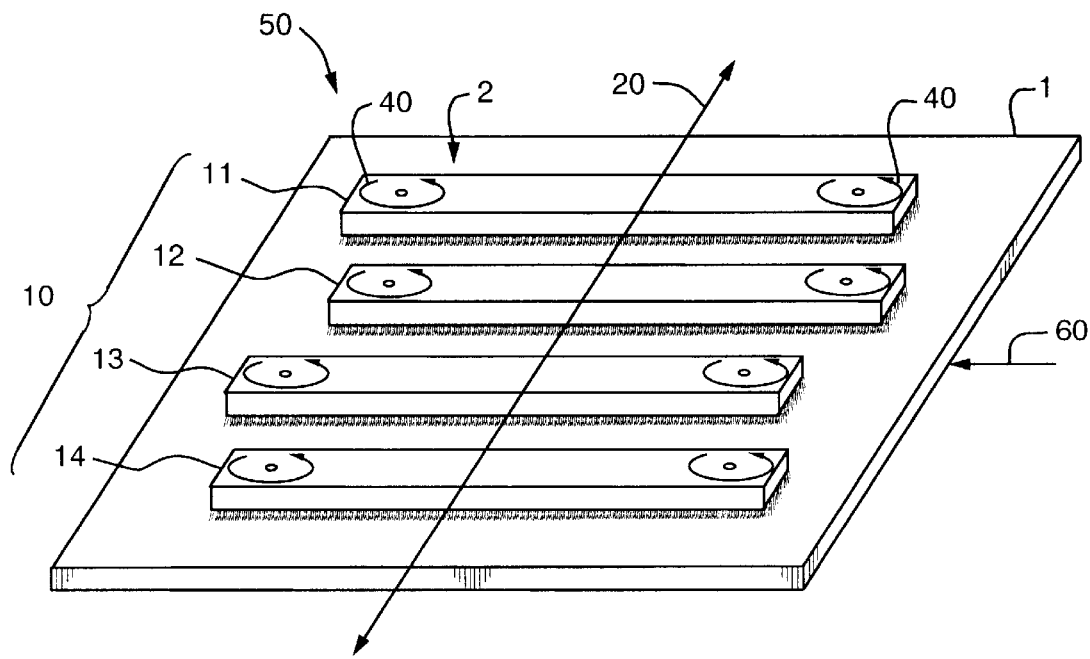
FIG. 1 illustrates an isometric view of the brushing section where the method of the present invention is implemented.

FIG. 1 illustrates a method, according to the present invention, for making plates from a sheet (1) of a photopolymer which has previously been exposed to ultraviolet radiation in order to convert the photopolymer sheets into printing plates for flexographic, letterpress or dry-offset printing. One stage of the manufacturing process is comprised of brushing the exposed face of the sheet (1) with a brush assembly (10) including a row (2) of flat brushes (11, 12, 13, 14) having generally rectangular brushing surfaces. The brushes (11, 12, 13, 14) each undergo a movement (40) of horizontal rotation and the brush assembly (10) also undergoes at least one movement (20) of reciprocating horizontal translation.

In accordance with the method of the present invention, each brush (11, 12, 13, 14) is offset by 180° in its horizontal rotation (40) with respect to the immediately adjacent brush, or to the two immediately adjacent brushes in the row (2) of brushes. As a result, the stresses induced in the sheet (1) by the rotation of each brush are cancelled by the stresses induced in the opposite direction on the sheet (1) by the rotation of the immediately adjacent brush, or of the two immediately adjacent brushes in the row (2) of brushes.

The method of the present invention is further characterized by a brushing operation which is performed continuously, in a brushing section (50), by advancing (60) the sheet (1) at a constant speed through the brushing section (50). As a result, continuous brushing of the photopolymer sheet, in accordance with the present invention, is perfectly compatible with current methods for the continuous production of flexible plates.

The brushing section (50) is defined by the extreme positions of the brushes. On the one hand, the brushing section (50) is defined by the furthest forward and furthest back positions of the brushes, in the direction of forward travel (60). On the other hand, the brushing section (50) is defined by the furthest forward and furthest back positions of the brushes, in a direction at a right angle to the direction of forward travel (60).

The photopolymer sheet (1) is preferably introduced into the brushing section (50) at a right angle to the width of the brushes (11, 12, 13, 14), in a direction lengthwise to the brushes (11, 12, 13, 14), so that brushing is more effective.

The brushing section (50) does not necessarily cover the entire length of the photopolymer sheet (1), but will cover at least the width of the sheet (1) in the direction of forward travel (60). This makes it possible to produce very long plates which were previously impossible to produce.

The speed of the horizontal rotation (40) of each brush (11, 12, 13, 14) is preferably constant and identical in terms of direction and magnitude to that of the other brushes. It is also preferable that all of the horizontal rotations (40) are achieved using a single, motor-type, rotational drive.

It is important to note that the speed of the movement of reciprocating horizontal translation (20), unlike that of the horizontal rotational movement (40), plays no part in achieving the multi-directional brushing needed to form an ideal relief. The movement of reciprocating horizontal translation (20) is useful only in evening out the brushing across the entire surface that is to be brushed.

The movement of reciprocating horizontal translation (20) may be performed at a slow speed in order to minimize the risk of moving the photopolymer sheet (1) during brushing. As a result, all portions of the sheet (1) which have to be brushed are done so perfectly and quickly.

An apparatus for implementing the method of the present invention is generally comprised of a brush assembly (10) having a row (2) of flat brushes (11, 12, 13, 14) with generally rectangular brushing surfaces. The brushes (11, 12, 13, 14) each undergo a movement (40) of horizontal rotation and the brush assembly (10) also undergoes at least one movement of reciprocating horizontal translation (20).

Figure 2:
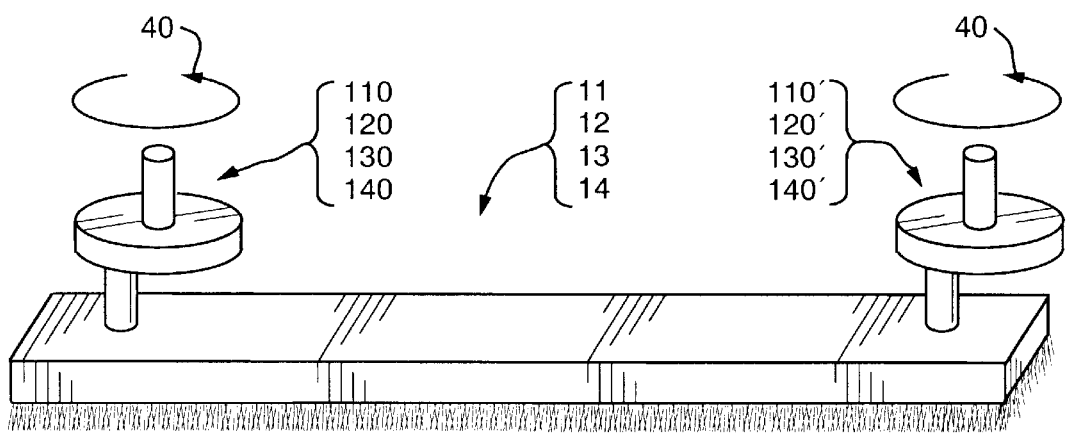
FIG. 2 illustrates a brush according to the present invention, which is fitted with two cranks.

Each brush (11, 12, 13, 14) is driven in horizontal rotation (40), by at least one crank (110, 110', 120, 120', 130, 130', 140, 140'), as illustrated in FIG. 2. Preferably, each brush (11, 12, 13, 14) is driven in horizontal rotation (40) by two cranks (110, 110'), (120, 120'), (130, 130'), (140, 140'), respectively.

Each crank has an input shaft, driven in rotation by suitable means, and an output shaft connected directly to the brush. The input shafts of each crank are offset with respect to the output shafts, but the input shafts of each pair of cranks are rotated together and turn at the same speed. This is preferably done using a single means of rotation, and means for inverting the transmission from one adjacent brush to the next in the row (2).

As a result, the output shafts of each pair of cranks are always in the same angular position, and always give rise to the same movement of horizontal rotation (40) of the brushes (11, 12, 13, 14). Furthermore, the output shafts of each pair of cranks are always in the same angular position as the output shafts of each pair of cranks of the brush or brushes located just after the immediately adjacent brush or brushes in the row (2).

The number of brushes essentially depends on the width of the brushing section that needs to be covered. There is preferably an even number of brushes (11, 12, 13, 14). If the rate of advance (60) is very high, it is possible to juxtapose a number of brushing sections (50) in the direction of forward travel (60) so as to improve the brushing process.

FIGS. 3A through 3D sequentially illustrate an example of the movement of horizontal rotation (40) and of the offset of 180° between two immediately adjacent brushes in the row (2). For reasons of clarity, the movement of reciprocating horizontal translation (20) is not illustrated in these figures, and the cranks (110, 110', 120, 120', 130, 130', 140, 140') are shown with rectangular crank webs, rather than the circular ones illustrated in FIG. 2.

Figure 3A:
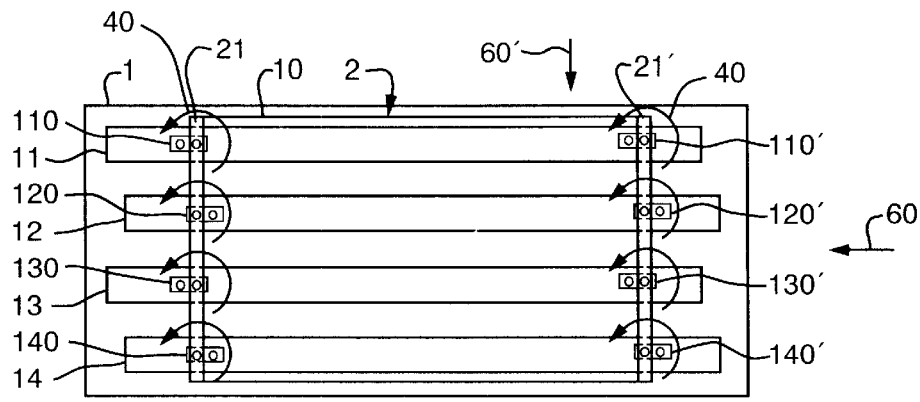
FIGS. 3A through 3D sequentially illustrate movement of the brushes, in horizontal rotation, at 0°, 90°, 180° and 270° with respect to an origin, respectively.
Figure 3B:
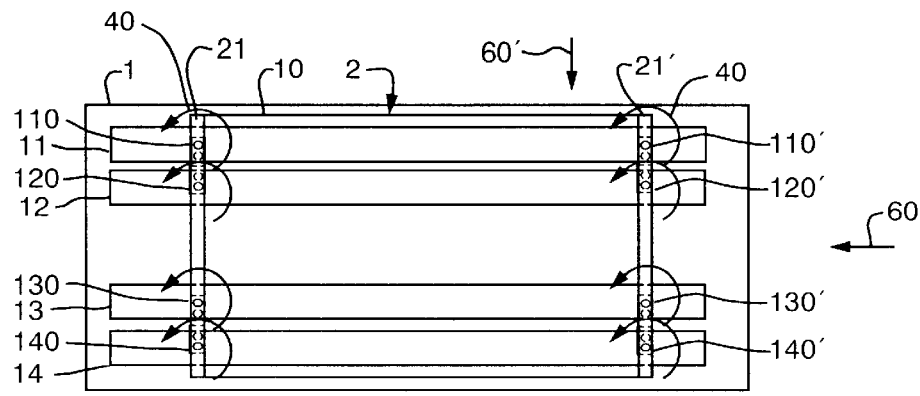
Figure 3C:
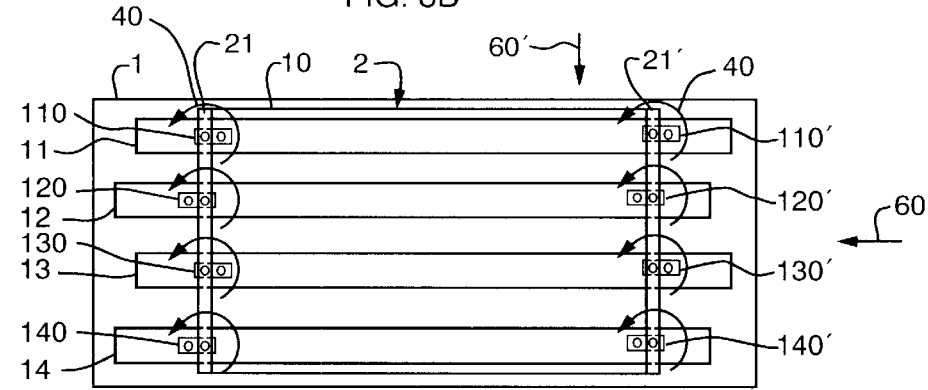
Figure 3D:
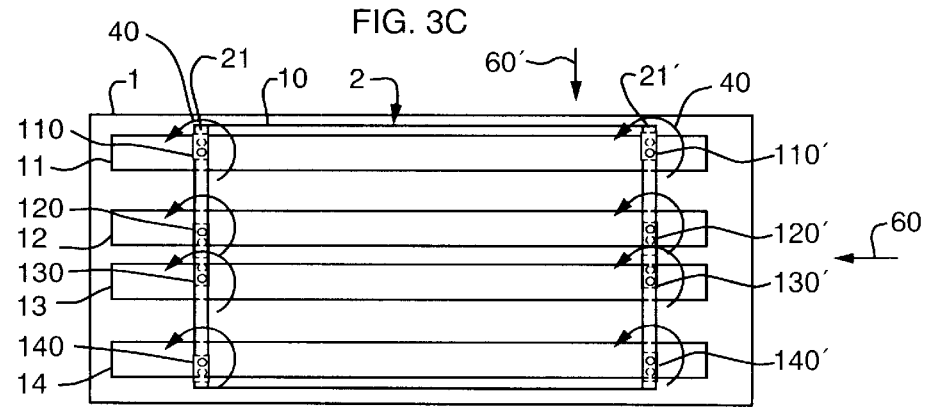

Taking FIG. 3A to illustrate a starting position, with respect to the direction of horizontal rotation (40), then FIG. 3B illustrates the position of the brushes after a rotation through 90° with respect to the position illustrated in FIG. 3A. FIG. 3C then illustrates the position of the brushes after a rotation through 180° with respect to the position illustrated in FIG. 3A. FIG. 3D then illustrates the position of the brushes after a rotation through 270° with respect to the position illustrated in FIG. 3A.

Taking the example of the brush (12) shown in FIG. 3A, the brush (12) is in its furthest back position with respect to the direction of forward travel (60) and is in a central position with respect to the direction (60'), defined arbitrarily. In FIG. 3B, the brush (12) is in its furthest back position with respect to the direction (60') and is in a central position with respect to the direction of forward travel (60). In FIG. 3C, the brush (12) is in its furthest forward position with respect to the direction of forward travel (60) and is in a central position with respect to the direction (60'). In FIG. 3D, the brush (12) is in its furthest forward position with respect to the direction (60') and in a central position with respect to the direction of forward travel (60). From this, it is clearly seen that in all positions, the brush (12) occupies a position which is exactly 180° from the positions occupied by the immediately adjacent brushes (11, 13) in the row (2).

FIGS. 3A through 3D also illustrate that the spacing between each brush (11, 12, 13, 14) forming the row (2) is variable, and that the spacing between the input shafts of the cranks (110, 120, 130, 140), on the one hand, and between the input shafts of the cranks (110', 120', 130', 140'), on the other hand, are always identical as a result of the respective retaining bars (21, 21').

What is claimed is:

1. A method for making a plate from a photopolymer sheet which has been exposed to ultraviolet radiation to convert the sheet into a printing plate for a flexographic, letterpress or dry-offset printing process, the method comprising the steps of brushing exposed face portions of the sheet with a brush assembly having a row of flat brushes with generally rectangular brushing surfaces, and positioning each brush so that the brush is offset by 180° in horizontal rotation with respect to an immediately adjacent brush while horizontally rotating the brush and while the brush assembly is moved in reciprocating horizontal translation.

2. The method of claim 1 which further includes the step of horizontally rotating the row of brushes while the brush assembly is moved in reciprocating horizontal translation.

3. The method of claim 2 wherein each brush is positioned so that the brush is offset by 180° in horizontal rotation with respect to two immediately adjacent brushes in the row.

4. The method of claim 1 which further includes the step of continuously performing the brushing step.

5. The method of claim 4 which further includes the step of advancing the sheet through the brush assembly at a constant speed.

6. The method of claim 1 wherein the brushes have a length and a width, and which further includes the step of introducing the sheet into the brush assembly at a right angle to the width of the brushes.

7. The method of claim 1 which further includes the step of horizontally rotating each of the brushes at a constant speed.

8. The method of claim 7 wherein the horizontal rotation of each of the brushes is identical in direction and magnitude.

9. The method of claim 1 which further includes the step of horizontally rotating all of the brushes with a single rotational drive.

* * * * *